(12) United States Patent
Yamazaki et al.

(10) Patent No.: US 11,011,440 B2
(45) Date of Patent: May 18, 2021

(54) SEMICONDUCTOR ELEMENT BONDING BODY, SEMICONDUCTOR DEVICE, AND METHOD OF MANUFACTURING SEMICONDUCTOR ELEMENT BONDING BODY

(71) Applicant: MITSUBISHI ELECTRIC CORPORATION, Chiyoda-ku (JP)

(72) Inventors: Koji Yamazaki, Chiyoda-ku (JP); Tomoaki Kato, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 22 days.

(21) Appl. No.: 16/480,106

(22) PCT Filed: Dec. 20, 2017

(86) PCT No.: PCT/JP2017/045812
§ 371 (c)(1),
(2) Date: Jul. 23, 2019

(87) PCT Pub. No.: WO2018/173394
PCT Pub. Date: Sep. 27, 2018

(65) Prior Publication Data
US 2020/0273762 A1 Aug. 27, 2020

(30) Foreign Application Priority Data

Mar. 23, 2017 (JP) .............................. JP2017-057423

(51) Int. Cl.
*H01L 23/14* (2006.01)
*H01L 21/52* (2006.01)
*H01L 23/367* (2006.01)

(52) U.S. Cl.
CPC ............ *H01L 23/142* (2013.01); *H01L 21/52* (2013.01); *H01L 23/3672* (2013.01)

(58) Field of Classification Search
CPC .... B23K 20/021; B23K 20/16; B23K 20/233; B23K 20/24; H01L 21/52; H01L 23/13;
(Continued)

(56) References Cited

U.S. PATENT DOCUMENTS

2011/0291111 A1* 12/2011 Nagai ..................... H01L 23/10
257/77
2013/0092421 A1* 4/2013 Kajiya ................. H05K 1/0206
174/252
(Continued)

FOREIGN PATENT DOCUMENTS

JP 2008-205265 A 9/2008
JP 2012-54358 A 3/2012
JP 2013-187418 A 9/2013

OTHER PUBLICATIONS

International Search Report dated Mar. 13, 2018 in PCT/JP2017/045812 filed Dec. 20, 2017.

*Primary Examiner* — Allan R Wilson
(74) *Attorney, Agent, or Firm* — Xsensus LLP

(57) ABSTRACT

A semiconductor element bonding body including: a substrate, in which a concave portion is formed; and a semiconductor element placed in the concave portion to be mounted to the substrate. A portion of the substrate in which the concave portion is formed is made of Cu. The concave portion has a perimeter portion in which a level difference is formed, and the level difference has a height d of 20 μm or more and less than 50 μm. The concave portion has a bottom surface having a flatness degree of $\lambda/8.7$ μm or more and $\lambda/1.2$ μm or less when a wavelength $\lambda$ of a laser is 632.8 nm. A metal film is formed on the semiconductor element, and the bottom surface of the concave portion and the metal film are bonded directly to each other.

6 Claims, 11 Drawing Sheets

(58) Field of Classification Search
CPC ............... H01L 23/142; H01L 23/3672; H01L 23/3735; H01L 24/83
See application file for complete search history.

(56) References Cited

U.S. PATENT DOCUMENTS

2015/0257252 A1* 9/2015 Kato ....................... H01L 24/83
257/773
2017/0144221 A1* 5/2017 Ghoshal .............. H01L 21/6835

* cited by examiner

FIG. 7

| | PRESSING PRESSURE [MPa] | SUBSTRATE CRACK | LEVEL DIFFERENCE HEIGHT d [μm] | FLATNESS DEGREE INDEX VALUE a | λ/a [μm] | POSITIONAL SHIFT | INITIAL BONDING RATIO [%] | BONDING PROPERTIES | POST-H/C BONDING RATIO [%] | H/C PROPERTIES |
|---|---|---|---|---|---|---|---|---|---|---|
| COMPARATIVE EXAMPLE 1 | 0 | ○ | 0 | 0.1 | 5.43 | × | 21 | × | 0 | × |
| COMPARATIVE EXAMPLE 2 | 50 | ○ | 5 | 0.3 | 2.12 | × | 72 | × | 45 | × |
| COMPARATIVE EXAMPLE 3 | 60 | ○ | 8 | 0.5 | 1.30 | × | 86 | × | 76 | × |
| COMPARATIVE EXAMPLE 4 | 70 | ○ | 14 | 0.6 | 1.00 | × | 94 | × | 90 | × |
| EXAMPLE 1 | 80 | ○ | 20 | 1.2 | 0.53 | ○ | 96 | ○ | 95 | ○ |
| EXAMPLE 2 | 90 | ○ | 26 | 2.6 | 0.24 | ○ | 98 | ○ | 97 | ○ |
| EXAMPLE 3 | 100 | ○ | 34 | 4.8 | 0.13 | ○ | 100 | ○ | 99 | ○ |
| EXAMPLE 4 | 110 | ○ | 41 | 7.7 | 0.08 | ○ | 100 | ○ | 100 | ○ |
| EXAMPLE 5 | 120 | ○ | 48 | 8.7 | 0.07 | ○ | 100 | ○ | 100 | ○ |
| COMPARATIVE EXAMPLE 5 | 130 | × | 50 | 10.7 | 0.06 | ○ | 100 | ○ | - | - |
| COMPARATIVE EXAMPLE 6 | 140 | × | 53 | 12.4 | 0.05 | ○ | 100 | ○ | - | - |
| COMPARATIVE EXAMPLE 7 | 150 | × | 54 | 14.1 | 0.05 | ○ | 100 | ○ | - | - |
| COMPARATIVE EXAMPLE 8 (SINTERED Ag) | 100 | ○ | 34 | 4.8 | 0.13 | ○ | 100 | ○ | 70 | × |

SEMICONDUCTOR ELEMENT BONDING BODY, SEMICONDUCTOR DEVICE, AND METHOD OF MANUFACTURING SEMICONDUCTOR ELEMENT BONDING BODY

CROSS-REFERENCE TO RELATED APPLICATIONS

This application is a United States national stage application of International Application No. PCT/JP2017/045812, filed Dec. 20, 2017, which designates the United States, and claims priority to Japanese Patent Application No. 2017-057423, filed Mar. 23, 2017, and the entire contents of each of the above applications are hereby incorporated herein by reference in entirety.

TECHNICAL FIELD

The present invention relates to a semiconductor element bonding body for use in electronic equipment or other uses, a semiconductor device, and a method of manufacturing a semiconductor element bonding body.

BACKGROUND ART

There has been known a method of manufacturing a semiconductor device in which a semiconductor chip is bonded to a substrate through use of, as a bonding material, metal paste containing metal particles and an organic solvent. In this method of manufacturing a semiconductor device of the related art, after the semiconductor chip is bonded to the substrate via the metal paste, the organic solvent is evaporated from the metal paste to turn the metal paste into an aggregate, the metal particles in the aggregate are reduced, and the semiconductor chip is then pressed to the substrate until the aggregate is crushed, thereby bonding the semiconductor chip to the substrate (see Patent Literature 1, for example).

There has also been known a semiconductor device in which a semiconductor element is bonded to a substrate via a bonding layer including a metal solid dispersion layer and a metal layer (see Patent Literature 2, for example).

Another semiconductor device that has been known uses an adhesive to bond a semiconductor element to a gold plating layer formed on a substrate (see Patent Literature 3, for example).

CITATION LIST

Patent Literature

[PTL 1] JP 2012-54358 A
[PTL 2] JP 2013-187418 A
[PTL 3] JP 2008-205265 A

SUMMARY OF INVENTION

Technical Problem

However, in the semiconductor devices of the related art described in Patent Literature 1 and Patent Literature 3, the bonding material or adhesive interposed between the semiconductor element and the substrate serves as a thermal resistance, obstructing the transmission of heat generated in the semiconductor element to the substrate. This impairs the heat dissipation properties of the semiconductor element.

Further, in the semiconductor device of the related art described in Patent Literature 2, the semiconductor layer is bonded to the substrate via the bonding layer including the solid dispersion layer and the metal layer, and the complicate structure of the bonding layer causes management of the bonding temperature, the bonding time, and the thicknesses of the layers to be laborious. The semiconductor device is accordingly poor in mass producibility and in bonding quality stability. The complicate structure of the bonding layer also leads to large fluctuations in thermal resistance among the bonding layers of a plurality of semiconductor devices manufactured according to Patent Literature 2 and, in addition, allows only a limited amount of improvement in the heat dissipation properties of the semiconductor element.

For improved heat dissipation properties of a semiconductor element, solid-phase diffusion bonding is superior, in which the semiconductor element is bonded directly to a substrate without a bonding material interposed between the two. In order to bond the semiconductor element and the substrate by solid-phase diffusion bonding, however, a bonding surface of the substrate to which the semiconductor element is to be bonded is required to be smoothed by polishing. This means that, when the semiconductor element and the substrate are bonded to each other by an automated machine with the semiconductor element placed on the bonding surface of the substrate, the position of the semiconductor element relative to the substrate is shifted by vibration or other such factor during bonding.

Solution to Problem

The present invention has been made to solve the problems described above, and an object of the present invention is therefore to provide a semiconductor element bonding body, a semiconductor device, and a method of manufacturing a semiconductor element bonding body with which the heat dissipation properties of a semiconductor element can be improved and a positional shift of the semiconductor element relative to a mount member can be prevented.

Solution to Problem

According to one embodiment of the present invention, there is provided a semiconductor element bonding body including: a mount member, in which a concave portion is formed; and a semiconductor element placed in the concave portion to be mounted to the mount member, wherein a portion of the mount member in which the concave portion is formed is made of metal, wherein the concave portion has a perimeter portion in which a level difference is formed, and the level difference has a height of 20 μm or more and less than 50 μm, wherein the concave portion has a bottom surface having a flatness degree of $\lambda/8.7$ μm or more and $\lambda/1.2$ μm or less when a wavelength $\lambda$ of a laser is 632.8 nm, wherein a metal film is formed on the semiconductor element, and wherein the bottom surface of the concave portion and the metal film are bonded directly to each other.

Advantageous Effects of Invention

According to the semiconductor element bonding body and semiconductor device of the present invention, and the method of manufacturing a semiconductor element bonding body of the present invention, bonding between the bottom surface of the concave portion and the metal film has fine properties, with the result that heat dissipation properties of the semiconductor element can be improved. A positional shift of the semiconductor element relative to the mount member can be prevented as well.

BRIEF DESCRIPTION OF DRAWINGS

FIG. 7 is a table for showing results of evaluating Comparative Examples 1 to 7 and Examples 1 to 5.

DESCRIPTION OF EMBODIMENTS

Now, embodiments of the present invention are described with reference to the drawings.

First Embodiment

Figure 1:
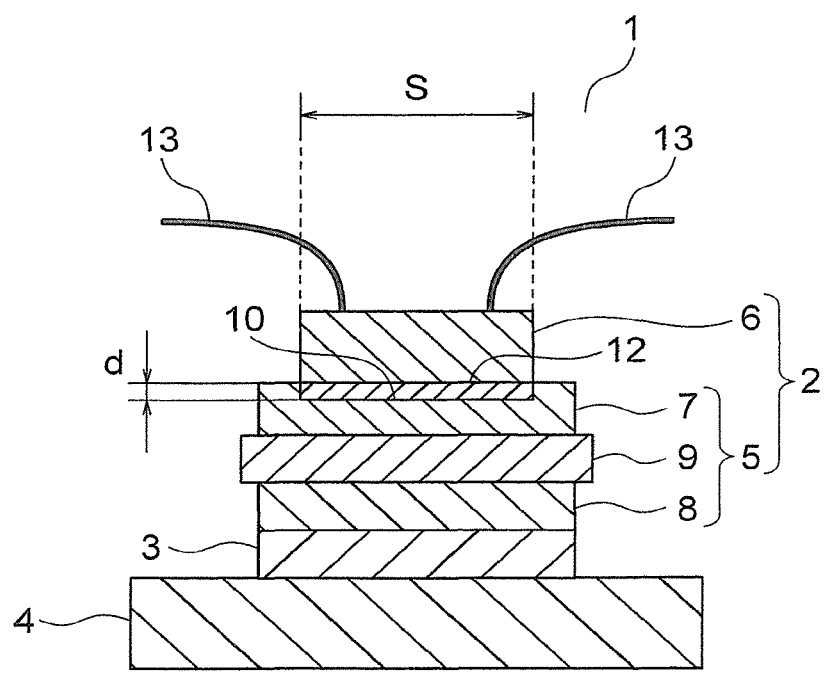
FIG. 1 is a sectional view of a semiconductor device according to a first embodiment of the present invention.

FIG. 1 is a sectional view for illustrating a semiconductor device according to a first embodiment of the present invention. In FIG. 1, a semiconductor device 1 includes a semiconductor element bonding body 2 and a heat dissipation plate 4 bonded to the semiconductor element bonding body via a bonding material 3.

The semiconductor element bonding body 2 includes a substrate 5, which is a mount member, and a semiconductor element 6 mounted on the substrate 5.

A direct bonded copper (DBC) substrate is used as the substrate 5. The substrate 5 includes a first surface layer 7, a second surface layer 8, and a middle layer 9 placed between the first surface layer 7 and the second surface layer 8. The first surface layer 7 and the second surface layer 8 are each a metal layer made of copper. The middle layer 9 is a ceramic layer made of $Si_3N_4$.

A brazing filler metal is used to bond the middle layer 9 to the first surface layer 7 and the second surface layer 8. For example, an Ag—Cu eutectic brazing filler metal, or an Ag—Cu—Ti brazing filler metal in which a small amount of Ti is added to promote reaction with ceramic, is used as the brazing filler metal bonding the middle layer 9 to the first surface layer 7 and the second surface layer 8.

A concave portion 10 is formed in the first surface layer 7. A part of the substrate 5 in which the concave portion 10 is formed is accordingly made of metallic Cu. The concave portion 10 is formed in a set mount area S, which is set in advance in the first surface layer 7. The flatness degree of a bottom surface of the concave portion 10 in units of µm is $\lambda/1.2$ µm or less when a wavelength $\lambda$ of an He—Ne laser is 632.8 nm=0.6328 µm. The flatness degree is defined here as the degree of deviation from an accurate plane. The flatness degree of the bottom surface is expressed, when the bottom surface is sandwiched between two planes parallel to each other, as a distance between the two planes at which a gap between the two planes is smallest.

The semiconductor element 6 is fit in the concave portion 10. The semiconductor element 6 is thus placed in the set mount area S of the substrate 5. A level difference formed in a perimeter portion of the concave portion 10 runs along outer circumferential surfaces of the semiconductor element 6 to surround the outer circumferential surfaces of the semiconductor element 6. A height d of the level difference formed in the perimeter portion of the concave portion 10, namely, a depth d of the perimeter portion of the concave portion 10, is 20 µm or more and less than 50 µm.

The heat dissipation plate 4 is bonded to the second surface layer 8 via the bonding material 3, which contains metal particles. Heat from the substrate 5 is accordingly transmitted to the heat dissipation plate 4 via the bonding material 3. The heat transmitted to the heat dissipation plate 4 is released from the heat dissipation plate 4 to an outside.

A metal film 12 is formed on the semiconductor element 6. The metal film 12 is interposed between the bottom surface of the concave portion 10 and the semiconductor element 6. In this example, the metal film 12 is formed only on a bonding surface of the semiconductor element 6, which faces the bottom surface of the concave portion 10. The metal film 12 used in this example is a film made of Au, namely, a Au film.

The bottom surface of the concave portion 10 and the metal film 12 are bonded directly to each other. That is, the metal film 12 is bonded directly to the first surface layer 7. The first surface layer 7 and the metal film 12 are bonded to each other by metal diffusion in a solid-phase state without a bonding material interposed therebetween, namely, solid-phase diffusion bonding. A plurality of conductive wires 13 for establishing electrical conduction are connected to the semiconductor element 6.

Figure 2:
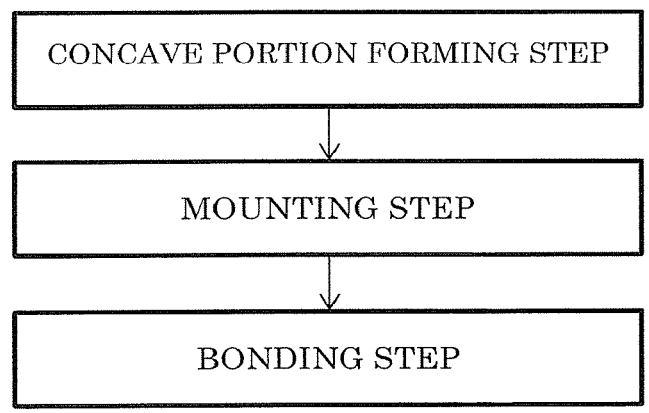
FIG. 2 is a flow chart for illustrating a procedure to be executed to manufacture a semiconductor element bonding body of FIG. 1.
Figure 3:
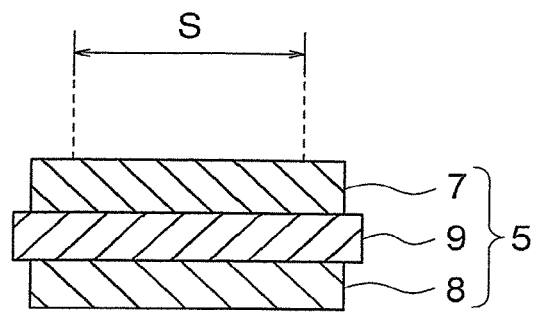
FIG. 3 is a sectional view for illustrating a substrate without a concave portion of FIG. 1.
Figure 4:
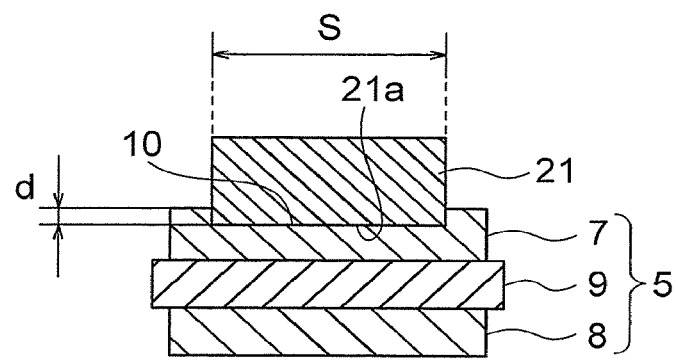
FIG. 4 is a sectional view for illustrating a state in which press working is performed on the substrate of FIG. 3.
Figure 5:
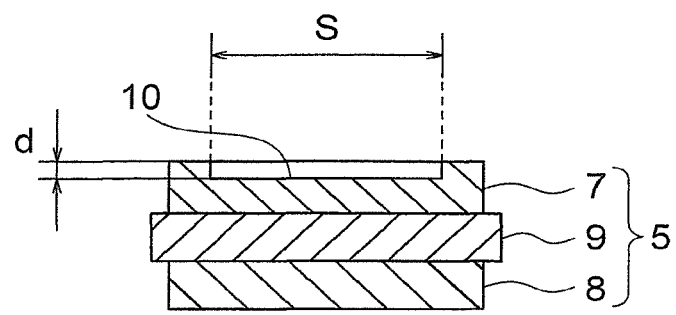
FIG. 5 is a sectional view for illustrating a state in which the concave portion is formed in the substrate of FIG. 4.
Figure 6:
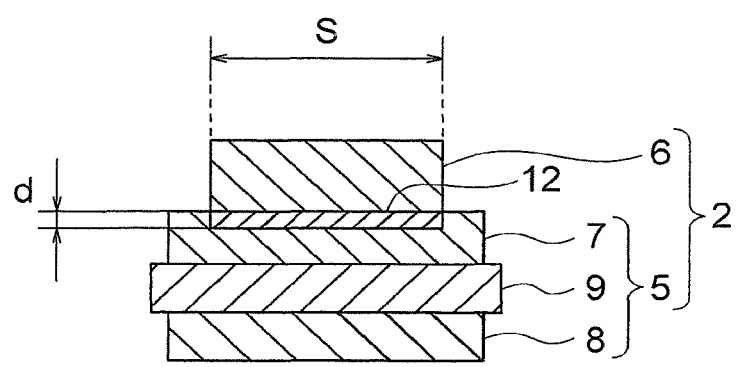
FIG. 6 is a sectional view for illustrating a state in which a semiconductor element is bonded to the substrate of FIG. 5.

A method of manufacturing the semiconductor element bonding body 2 is described next. FIG. 2 is a flow chart for illustrating a procedure to be executed to manufacture the semiconductor element bonding body 2 of FIG. 1. FIG. 3 to FIG. 6 are sectional views for illustrating states of the semiconductor element bonding body 2 of FIG. 1 during manufacture. FIG. 3 is a sectional view for illustrating the substrate 5. FIG. 4 is a sectional view for illustrating a state in which press working is performed on the substrate 5. FIG. 5 is a sectional view for illustrating a state in which the concave portion 10 is formed in the substrate 5. FIG. 6 is a sectional view for illustrating a state in which the semiconductor element 6 is bonded to the substrate 5.

When the semiconductor element bonding body 2 is to be manufactured, the substrate 5, which is a mount member, is prepared first as illustrated in FIG. 3. In this example, a DBC substrate is prepared as the substrate 5.

As illustrated in FIG. 4, press working is subsequently performed on the substrate 5 by pressing a press surface 21a of a pressing jig 21 to the set mount area S in the first surface layer 7 of the substrate 5. The press working in this example is performed on the substrate 5 at a pressing pressure of 80 MPa or more and 120 MPa or less. As illustrated in FIG. 5, this forms the concave portion 10 in the set mount area S of the first surface layer 7, thereby fabricating the substrate 5 in which the concave portion 10 is formed. The press surface 21a of the pressing jig 21 is a smooth surface high in flatness degree and low in surface roughness. The flatness degree of the press surface 21a is accordingly transferred to the set mount area S in the first surface layer 7 of the substrate 5 by the press working. This gives the bottom surface of the concave portion 10 the same flatness degree and surface roughness as the flatness degree and surface roughness of the press surface 21a (a concave portion forming step).

The semiconductor element 6 with the metal film 12 formed thereon is then fit in the concave portion 10. The semiconductor element 6 is placed in the concave portion 10 with the metal film 12 laid on the bottom surface of the concave portion 10. The metal film 12 is formed on the bonding surface of the semiconductor element 6. The concave portion 10 is shaped to a shape of the bonding surface of the semiconductor element 6 (a mounting step).

Heat and pressure are then applied to the substrate 5 and the semiconductor element 6 in the atmospheric air, thereby bonding the metal film 12 and the substrate 5 directly to each other. A temperature at which the substrate 5 and the semiconductor element 6 are heated is lower than 1,083° C., which is the melting point of Cu as a metal that is a constituent of the first surface layer 7 of the substrate 5, and lower than 1,063° C., which is the melting point of Au as a metal that is a constituent of the metal film 12. Specifically, a temperature of 200° C. or more and less than 350° C. and a pressurizing force of 1 MPa or more and less than 50 MPa are used to cause metal diffusion in a solid-phase state between the first surface layer 7 of the substrate 5 and the metal film 12, and the substrate 5 and the metal film 12 are bonded to each other by the metal diffusion (a bonding step). As illustrated in FIG. 6, the semiconductor element bonding body 2 is completed in this manner.

The semiconductor device 1 is manufactured by bonding the heat dissipation plate 4 to the second surface layer 8 of the semiconductor element bonding body 2 via the bonding material 3, and also connecting the plurality of conductive wires 13 to the semiconductor element 6 of the semiconductor element bonding body 2.

A sample of the semiconductor element bonding body 2 was manufactured as follows in order to evaluate a state of bonding between the metal film 12 and semiconductor element 6 of the semiconductor element bonding body 2.

First, an SiC chip and a DBC substrate were prepared as the semiconductor element 6 and the substrate 5, respectively. The semiconductor element 6 was □10 mm in bonding surface size and 0.35 mm in thickness. The symbol "□" is an auxiliary dimension symbol indicating the size of a square. For instance, "□10 mm" means a square that is 10 mm in length across and down.

The metal film 12 is formed on the bonding surface of the semiconductor element 6. The metal film formed on the semiconductor element is normally a Au film in bonding that uses a solder material, from the viewpoint of oxidation prevention and solder wettability. In this example, too, an Au film is used as the metal film 12 formed on the bonding surface of the semiconductor element 6.

A planar size of the substrate 5 is □25 mm in the first surface layer 7, which is made of Cu, □29 mm in the middle layer 9, which is made of $Si_3N_4$, and □25 mm in the second surface layer 8, which is made of Cu. A planar size of the middle layer 9 is accordingly larger than the planar size of each of the first surface layer 7 and the second surface layer 8. With those dimensions, a perimeter portion of the middle layer 9 serves as an exposed portion in which there is no overlap between the first surface layer 7 and the second surface layer 8. The exposed portion of the middle layer 9 protrudes farther than the first surface layer 7 and the second surface layer 8 by (29 [mm]-25 [mm])/2=2 [mm] along the entire perimeter of the middle layer 9. The first surface layer 7 is 0.8 mm in thickness, the middle layer 9 is 0.32 mm in thickness, and the second surface layer 8 is 0.8 mm in thickness.

A surface of a DBC substrate is sometimes plated by Ni plating or Ag plating, which gives a glossy appearance. In this example, however, no plating is performed on the surface of the substrate 5.

The pressing jig 21 made from SKD11, which is a steel product, was then prepared. The size of the press surface 21a of the pressing jig 21 was set to □10.3 mm in consideration of the bonding surface size of the semiconductor element 6, □10 mm, and the mount precision of a mounter, ±0.1 mm.

The flatness degree of the press surface 21a of the pressing jig 21 was measured with a laser interferometer using an He—Ne laser. The flatness degree measurement with the laser interferometer was based on the pitch between interference bands formed by irradiation from the He—Ne laser, and on the curving degree of the interference bands, with reference to Patent Literature 1. Measurement of the flatness degree is classified into measurement using a dial gauge, measurement using an optical flat, and measurement using a laser. In measurement using a dial gauge, the warping and rippling of a surface are measured by attaching a dial gauge to an arm and reading changes in value while tracing the object. In measurement using an optical flat, which is a measure made of transparent glass and having a flat measurement surface, the optical flat is brought into contact with a surface that is a measurement object, the contact surface is irradiated with short-wavelength light to generate light wave interference bands in the form of a band pattern, namely, Newton's rings, and a measurement is taken based on the number of Newton's rings. In measurement using a laser, a measurement object is irradiated with laser light, reflected light that is the laser light reflected by the measurement object forms an image on a CMOS sensor, and the image is measured. The method of measurement is defined in JIS B7441 of Japanese Industrial Standards: JIS. The surface roughness of the press surface 21a of the pressing jig 21 was measured through use of a stylus-type surface roughness tester by a procedure in conformity to (JIS B0633-2001).

The measurement described above revealed that the flatness degree of the press surface 21a of the pressing jig 21 was approximately λ/10 μm when the wavelength λ of the He—Ne laser is 632.8 nm=0.6328 μm. The press surface 21a of the pressing jig 21 also had a surface roughness Ra that was approximately 0.1 μm and a surface roughness Rz that was approximately 0.2 μm. The surface roughness Ra and the surface roughness Rz are surface roughness indices prescribed in JIS B0601-2001 (ISO 4287-1997). The surface roughness Ra is an arithmetic average roughness. The surface roughness Ra is a numerical value indicating, in the form of an average value, the concave-convex state of a segment that has a reference length and that is extracted from a roughness curve representing a measurement by a roughness tester. The surface roughness Rz is the maximum height. The surface roughness Rz is a value that is the sum of a height of the highest portion in a segment that has a reference length and that is extracted from a roughness curve representing a measurement by a roughness tester, namely, a maximum mountain height Rp, and a depth of the deepest portion in the section, namely, a maximum valley depth Rv.

The concave portion 10 was then formed in the first surface layer 7 by performing press working on the set mount area S in the first surface layer 7 of the substrate 5 through use of the pressing jig 21 (the concave portion forming step). The press working of the substrate 5 was performed with the temperature set to room temperature, 25° C., and the atmosphere set to the atmospheric air. The concave portion 10 was formed by applying a pressing pressure to the first surface layer 7 with the pressing jig 21 for the duration of 30 seconds. As samples in which the concave portion 10 was formed in the first surface layer 7, n samples, here, 5 samples were fabricated for each of twelve different pressing pressures, 0 MPa, 50 MPa, 60 MPa, 70 MPa, 80 MPa, 90 MPa, 100 MPa, 110 MPa, 120 MPa, 130 MPa, 140 MPa, and 150 MPa.

A sample in which the concave portion 10 was formed at a pressing pressure of 0 MPa is Comparative Example 1. A sample in which the concave portion 10 was formed at a pressing pressure of 50 MPa is Comparative Example 2. A sample in which the concave portion 10 was formed at a pressing pressure of 60 MPa is Comparative Example 3. A sample in which the concave portion 10 was formed at a pressing pressure of 70 MPa is Comparative Example 4. Similarly, samples in which the concave portion 10 was formed at a pressing pressure of 80 MPa, 90 MPa, 100 MPa, 110 MPa, and 120 MPa are Example 1, Example 2, Example 3, Example 4, and Example 5, respectively. Samples in which the concave portion 10 was formed at a pressing pressure of 130 MPa, 140 MPa, and 150 MPa are Comparative Example 5, Comparative Example 6, and Comparative Example 7, respectively.

After the concave portion forming step, observation of the substrate 5 in which the concave portion 10 had been formed by scanning acoustic tomography (SAT) with an ultrasonic imaging device (the device name: FineSAT III, a product of Hitachi Power Solutions Co., Ltd.) at a flaw detection frequency of 10 MHz, and external observation of the substrate 5 were conducted for each of Comparative Examples 1 to 7 and Examples 1 to 5 to determine presence or absence of a crack in the substrate. Specifically, it was determined that the substrate had a crack (x) when a crack was found in even one of the n samples, here, five samples, and it was determined that the substrate had no crack (○) when no crack was found in all of the n samples, here, five samples.

The level difference height d of the concave portion 10 in the samples was measured through use of a laser displacement gauge for each of Comparative Examples 1 to 7 and Examples 1 to 5. The level difference height was measured at the four corners of the concave portion 10, the largest value out of the level difference heights at the four corners was obtained in each of the n samples, here, five samples, and an average value (unit: μm) of the obtained values was calculated as the level difference height d of the samples. The level difference height d of the samples was rounded off to the closest whole number.

After the concave portion forming step, the flatness degree of the bottom surface of the concave portion 10 formed in the concave portion forming step was measured in the n samples, here, five samples, for each of Comparative Examples 1 to 7 and Examples 1 to 5 by the same method as the one used to measure the flatness degree of the press surface 21a of the pressing jig 21. That is, the flatness degree of the bottom surface of the concave portion 10 was measured in every one of the respective samples of Comparative Examples 1 to 7 and Examples 1 to 5. The flatness degree is normally expressed as λ/a μm through use of the wavelength λ of the He—Ne laser used in the measurement, 0.6328 μm, and an index value a for the flatness degree. In the first embodiment, too, an individual index value for the flatness degree was calculated from a measured value of the flatness degree of each sample, and an average value of individual index values for the flatness degree of the concave portion 10 in the n samples, here, five samples, was calculated as the index value a for the flatness degree for each of Comparative Examples 1 to 7 and Examples 1 to 5. The index value a for the flatness degree was rounded off to one decimal place. The flatness degree λ/a was rounded off to two decimal places, and the resultant value was used in evaluation.

A mounter was then used to place the semiconductor element 6 in the concave portion 10 formed in the first surface layer 7 (the mounting step). The semiconductor element 6 was placed in the concave portion 10 with the metal film 12 laid on the bottom surface of the concave portion 10.

After the mounting step, whether the position of the semiconductor element 6 placed in the concave portion 10 in the mounting step had shifted from the set mount area S, which is to be aimed for, was determined for each of Comparative Examples 1 to 7 and Examples 1 to 5. Specifically, it was determined that a positional shift of the semiconductor element 6 had occurred (x) when the position of the semiconductor element 6 was 0.3 mm or more away from the set mount area S, or when the semiconductor element 6 was rotated away from the set mount area S by 2° or more, and otherwise it was determined that no positional shift of the semiconductor element 6 had occurred (○).

The substrate 5 and the semiconductor element 6 were then heated at 300° C., which is a temperature lower than the melting point 1,083° C. of Cu as a metal that was a constituent of the first surface layer 7 of the substrate 5, and lower than the melting point 1,063° C. of Au as a metal that was a constituent of the metal film 12. In addition to the heat, a pressure of 30 MPa was applied to the substrate 5 and the semiconductor element 6 in the atmospheric air, and the application of heat and pressure was maintained for 5 minutes, thereby causing metal diffusion in a fixed-phase state between the first surface layer 7 of the substrate 5 and the metal film 12, and thus directly bonding the metal film 12 and the substrate 5 (the bonding step). Samples of the semiconductor element bonding body 2 were manufactured in this manner.

Whether or not an initial bonding ratio [%] of bonding between the metal film 12 and the substrate 5 was equal to or higher than a target value in the completed semiconductor element bonding body 2 was also determined for each of Comparative Examples 1 to 7 and Examples 1 to 5. Specifically, a section of a bonding portion between the metal film 12 and the substrate 5 was observed by SAT, and an image obtained by SAT was digitized with the use of software to calculate the initial bonding ratio [%]. The initial bonding ratio was rounded off to the closest whole number, and the resultant value was used in evaluation. The target value of the initial bonding ratio [%] was set to 95% in consideration of the thermal resistance in the bonding portion between the metal film 12 and the substrate 5. Accordingly, the bonding properties were determined as fine (○) when the initial bonding ratio [%] was equal to or higher than the target value, 95%, and as poor (x) when the initial bonding ratio [%] was less than the target value, 95%.

Heat cycle test as a reliability test was conducted on the completed semiconductor element bonding body 2 for each of Comparative Examples 1 to 7 and Examples 1 to 5. Heat cycle test (hereinafter may be abbreviated as "H/C") is a test in which low-temperature heat and high-temperature heat are repeatedly applied to a test object, and whether the test object develops a defect is determined to evaluate the reliability of the test object. In a heat cycle test conducted here, a cycle in which the semiconductor element bonding body 2 was kept at a low temperature of −55° C. for 15 minutes and at a high temperature of 175° C. for 15 minutes was repeated 600 times.

Whether or not the bonding ratio [%] of bonding between the metal film 12 and the substrate 5 was equal to or higher than a target value in the semiconductor element bonding body 2 subjected to the heat cycle test was determined for each of Comparative Examples 1 to 7 and Examples 1 to 5. Specifically, a section of the bonding portion between the metal film 12 and the substrate 5 in the semiconductor element bonding body 2 subjected to the heat cycle test was observed by SAT, and an image obtained by SAT was digitized with the use of software as in the calculation of the initial bonding ratio to calculate a post-H/C bonding ratio [%]. H/C properties were determined as fine (○) when the post-H/C bonding ratio [%] was equal to or higher than the target value, 95%, and as poor (x) when the post-H/C bonding ratio [%] was less than the target value, 95%.

Figure 8:
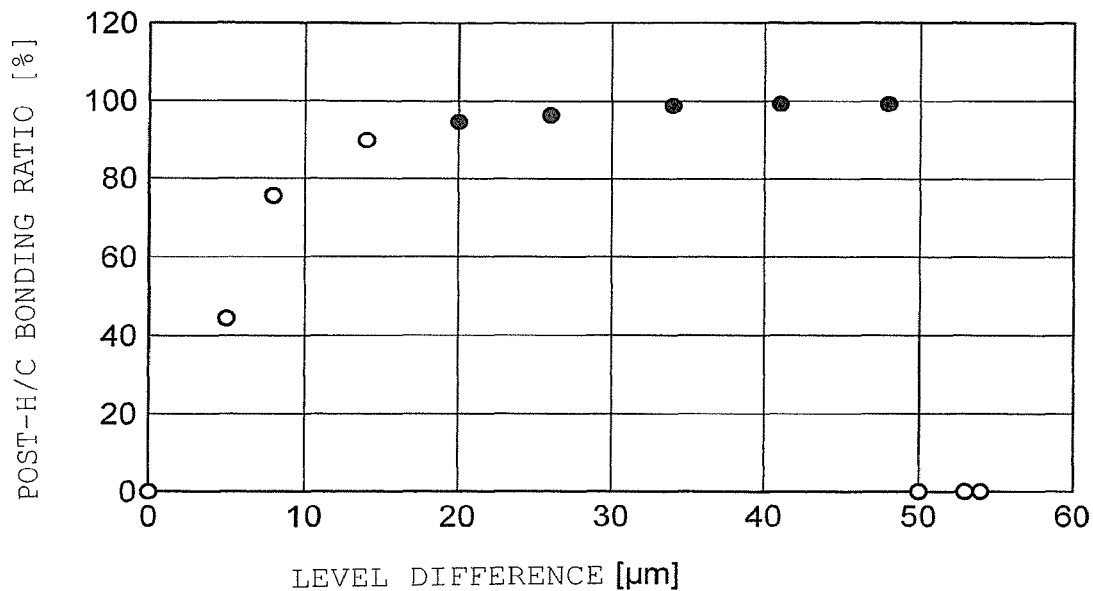
FIG. 8 is a graph for showing a relation between a level difference height d and a post-H/C bonding ratio in each of Comparative Examples 1 to 7 and Examples 1 to 5 of FIG. 7.
Figure 9:
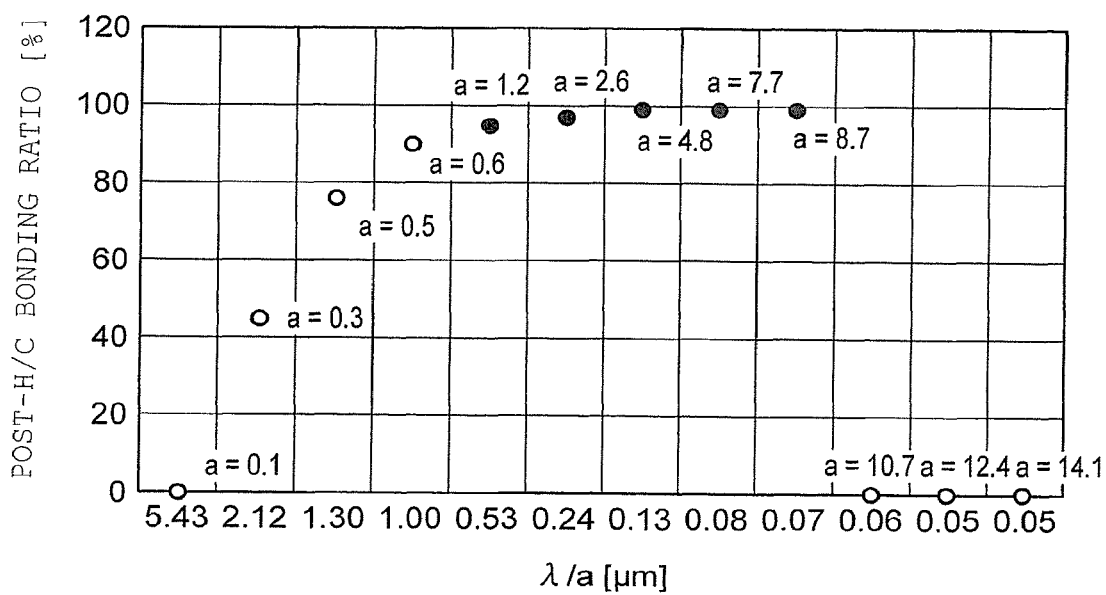
FIG. 9 is a graph for showing a relation between a flatness degree $\lambda/a$ and the post-H/C bonding ratio in each of Comparative Examples 1 to 7 and Examples 1 to 5 of FIG. 7.

FIG. 7 is a table for showing results of evaluating Comparative Examples 1 to 7 and Examples 1 to 5. FIG. 8 is a graph for showing a relation between the level difference height d and the post-H/C bonding ratio in each of Comparative Examples 1 to 7 and Examples 1 to 5 of FIG. 7. FIG. 9 is a graph for showing a relation between the flatness degree λ/a and the post-H/C bonding ratio in each of Comparative Examples 1 to 7 and Examples 1 to 5 of FIG. 7. In FIG. 8 and FIG. 9, Comparative Examples 1 to 7 are represented by white circles, and Examples 1 to 5 are represented by black circles. As shown in FIG. 7, in Comparative Examples 1 to 4, in which the pressing pressure in the concave portion forming step was 0 MPa or more and 70 MPa or less, it was determined that a positional shift of the semiconductor element 6 relative to the substrate 5 had occurred, and bonding properties were also determined as poor because the initial bonding ratio was lower than 95%. In Comparative Examples 5 to 7, in which the pressing pressure in the concave portion forming step was 130 MPa or more and 150 MPa or less, the substrate 5 was cracked due to an excessive pressing pressure, and it was determined that the substrate had a crack. The H/C properties of Comparative Examples 5 to 7 were determined as poor without conducting H/C because, with a crack in the substrate 5, shearing stress applied to the bonding portion in H/C is not applied normally.

Meanwhile, in Examples 1 to 5, in which the pressing pressure in the concave portion forming step was 80 MPa or more and 120 MPa or less, no crack in the substrate 5 and no positional shift of the semiconductor element 6 relative to the substrate 5 occurred, and bonding properties and H/C properties were both determined as fine. As is understood from FIG. 7 and FIG. 8, the level difference height d of the concave portion 10 is 20 μm or more and less than 50 μm in Examples 1 to 5. It has accordingly been confirmed that a positional shift of the semiconductor element 6 relative to the substrate 5 is prevented when the level difference height d of the concave portion 10 is 20 μm or more and less than 50 μm. It has also been confirmed from FIG. 7 and FIG. 9 that bonding between the metal film 12 and the substrate 5 has fine bonding properties when the index value a for the flatness degree is 1.2 or more and 8.7 or less, i.e., when the flatness degree λ/a of the bottom portion of the concave portion 10 is λ/8.7 or more and λ/1.2 or less. The flatness degree λ/a of the bottom portion of the concave portion 10 accordingly has λ/1.2 as an upper limit value and λ/8.7 as a lower limit value in the first embodiment. The surface roughness Ra of the bottom surface of the concave portion 10 formed in the concave portion forming step is less than 0.5 μm and the surface roughness Rz of the bottom surface is less than 1 μm in all of Examples 1 to 5.

A semiconductor element bonding body in which the substrate 5 and the semiconductor element 6 were bonded by a bonding material was manufactured next as Comparative Example 8. The substrate 5 of Comparative Example 8 was the substrate 5 of Example 3, in which the concave portion 10 was formed at a pressing pressure of 100 MPa. The bonding material of Comparative Example 8 was a sintered Ag paste product manufactured by DOWA Electronics Materials Co., Ltd. Also in Comparative Example 8, the metal film 12 and the substrate 5 were bonded by the bonding material under the same bonding condition as the bonding condition in Comparative Examples 1 to 7 and Examples 1 to 5, which is to applying a pressure of 30 MPa for 5 minutes at a temperature of 300° C. in the atmospheric air.

The same evaluation as the one described above was conducted for the semiconductor element bonding body of Comparative Example 8. The result of evaluating Comparative Example 8 is shown in FIG. 7 in addition to the evaluation results of Comparative Examples 1 to 7 and Examples 1 to 5. As is understood from FIG. 7, Comparative Example 8 was fine in initial bonding properties but was poor in H/C properties because a crack caused in the bonding portion between the substrate 5 and the semiconductor element 6 by H/C led to a significant drop in post-H/C bonding ratio.

In general, a semiconductor element bonding body in which a substrate and a semiconductor element are bonded via a bonding material has fine H/C properties because shearing stress applied to the bonding portion in H/C is dispersed more in a sintered Ag paste, which includes a bonding layer. This evaluation, however, yielded a different result. A section of the bonding portion between the metal film 12 of the semiconductor element 6 and the substrate 5 was therefore observed after the bonding step in Examples 1 to 5.

Figure 10:
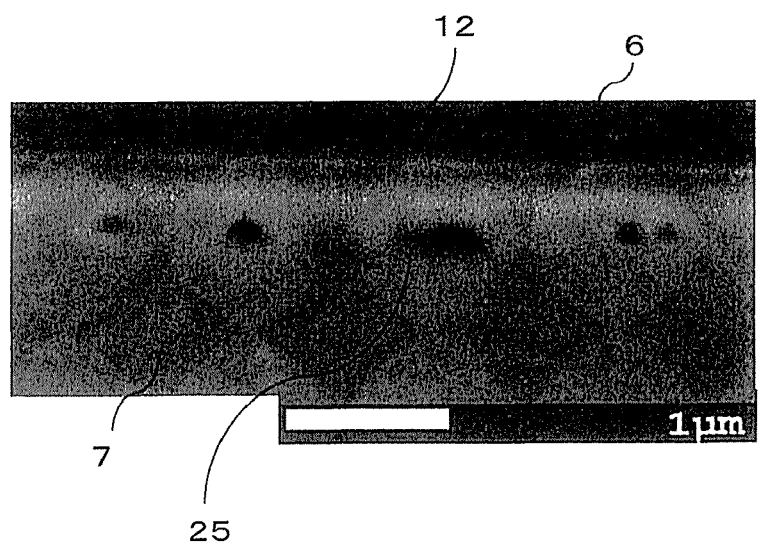
FIG. 10 is a sectional photograph (a photograph as a substitute for a drawing) for illustrating a bonding portion in which a metal film of the semiconductor element of FIG. 6 and a first surface layer of the substrate are bonded.

FIG. 10 is a sectional photograph for illustrating the bonding portion in which the metal film 12 of the semiconductor element 6 of FIG. 6 and the first surface layer 7 of the substrate 5 are bonded. Holes 25 having an average hole diameter of φ 0.1 μm or more and less than φ 0.4 μm are present in a bonding boundary between the metal film 12 made of Au and the first surface layer 7 made of Cu. This is considered to be a manifestation of the influence of the Kirkendall effect due to a difference in interdiffusion coefficient between Au and Cu, or the influence of minute surface irregularities of the substrate 5.

In Examples 1 to 5, a film of Cu oxides, namely, CuO and $Cu_2O$, which inhibit the diffusion reaction between metals, is left on the surface of the first surface layer 7 due to the use of the atmospheric air as the bonding atmosphere, and the bonding is performed without executing processing of removing the oxide film. Despite presence of the oxide film, the metal film 12 of the semiconductor element 6 and the first surface layer 7 are bonded well in Examples 1 to 5 presumably because Au of the metal film 12 is diffused so fast that the diffusion of Au into Cu is dominant over the growth of the oxide film on the surface of the first front surface layer 7, namely, the diffusion of Cu and O.

In Comparative Examples 1 to 7 and Examples 1 to 5, the metal film 12 and the first surface layer 7 are bonded by metal diffusion of Au and Cu. A layer of $Au_3Cu$, AuCu, and $AuCu_3$ is accordingly present as a solid dispersion layer of Au and Cu in the boundary between the metal film 12 and the first surface layer 7.

The evaluation described above was conducted for a plurality of semiconductor element bonding bodies 2 in which the thickness of the first surface layer 7 and the thickness of the second surface layer 8 were each varied from one semiconductor element bonding body 2 to another, within a range between and including 0.1 mm and 1.2 mm, and the same results were obtained.

A change in the thickness and material of the first surface layer 7, the second surface layer 8, and the middle layer 9 changes the equivalent thermal expansion coefficient of the substrate 5 and also changes the shearing stress caused in the bonding portion by H/C. In this example, a thermal expansion coefficient α of the substrate 5 used in the evaluation is approximately 12.5 ppm. When the thicknesses of the first surface layer 7 and the second surface layer 8 are each changed to 1.2 mm, the thermal expansion coefficient α of the substrate 5 changes to approximately 13.6 ppm. When the thicknesses of the first surface layer 7 and the second surface layer 8 are each changed to 0.1 mm, the thermal expansion coefficient α of the substrate 5 changes to approximately 5.9 ppm. Accordingly, as long as the thermal expansion coefficient α of the substrate 5 is 6 ppm or more and 13 ppm or less, the same effect is obtained even when the material from which the middle layer 9 of the substrate 5 is formed is AlN or $Al_2O_3$ instead of $Si_3N_4$.

In such a semiconductor element bonding body 2, the bottom surface of the concave portion 10 and the metal film 12 are bonded well because the level difference height d of the concave portion 10 is 20 μm or more and less than 50 μm, the bottom surface of the concave portion 10 has a flatness degree of λ/8.7 μm or more and λ/1.2 μm or less, the portion of the substrate 5 in which the concave portion 10 is formed is made of metallic Cu, and the metal film 12 formed on the semiconductor element 6 and the bottom surface of the concave portion 10 are bonded directly to each other.

This reduces the thermal resistance in the bonding portion between the metal film 12 of the semiconductor element 6 and the substrate 5, thereby improving the heat dissipation properties of the semiconductor element 6. This also prevents a positional shift of the semiconductor element 6 relative to the substrate 5. In addition, with the metal film 12 and the substrate 5 bonded directly, a bonding material in the bonding of the metal film 12 and the substrate 5 can be omitted, with the result that the semiconductor element bonding body 2 can easily be manufactured at low cost.

The metallic Au is included in the material of the metal film 12, and hence metal diffusion between the metallic Au of the metal film 12 and a metal of the substrate 5 is facilitated so that the substrate 5 and the metal film 12 can be bonded to each other more reliably.

An average diameter of the holes present in the boundary between the bottom surface of the concave portion 10 and the metal film 12 is φ 0.1 μm or more and less than φ 0.4 μm, and the diameter of the holes present in the boundary between the bottom surface of the concave portion 10 and the metal film 12 can thus be limited to a certain range. This keeps bonding properties of the bonding between the substrate 5 and the metal film 12 at a fine level, and a further improvement in the heat dissipation properties of the semiconductor element 6 can be expected.

In the semiconductor device 1, the heat dissipation plate 4 is bonded to the substrate 5 of the semiconductor element bonding body 2 via the bonding material 3, and hence the heat dissipation properties of the semiconductor element 6 can be improved even more reliably owing to the heat dissipation plate 4, in addition to having the same effects as the effects of the semiconductor element bonding body 2.

In the method of manufacturing the semiconductor element bonding body 2, the semiconductor element 6 is placed in the concave portion 10 after the substrate 5 with the concave portion 10 formed therein is manufactured, and the metal film 12 of the semiconductor element 6 and the substrate 5 are bonded to each other by applying a temperature of 200° C. or more and less than 350° C. and a pressurizing force of 1 MPa or more and less than 50 MPa. The bottom surface of the concave portion 10 and the metal film 12 is accordingly bonded well, with the result that the heat dissipation properties of the semiconductor element 6 can be improved. With the concave portion 10 formed in the substrate 5, a positional shift of the semiconductor element 6 relative to the substrate 5 can be prevented as well. In addition, a bonding material in the bonding of the metal film 12 and the substrate 5 can be omitted so that the manufacture of the semiconductor element bonding body 2 can easily be manufactured at low cost.

The press working performed on the substrate 5 to form the concave portion 10 in the substrate 5 uses a pressing pressure of 80 MPa or more and 120 MPa or less. Consequently, a crack in the substrate 5 is prevented and the concave portion 10 capable of preventing a positional shift of the semiconductor element 6 relative to the substrate 5 can be formed in the substrate 5.

Second Embodiment

In the first embodiment, the concave portion 10 is formed in the substrate 5 by performing press working on the substrate 5 in the concave portion forming step. However, the present invention is not limited thereto, and the concave portion 10 may be formed in the substrate 5 by etching the substrate 5 in the concave portion forming step.

Figure 11:
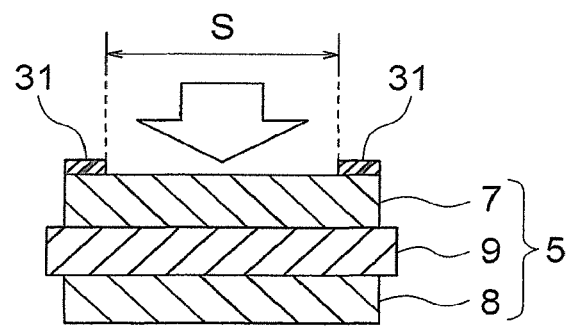
FIG. 11 is a sectional view for illustrating a state in which a resist film is formed on a substrate of a semiconductor element bonding body according to a second embodiment of the present invention.
Figure 12:
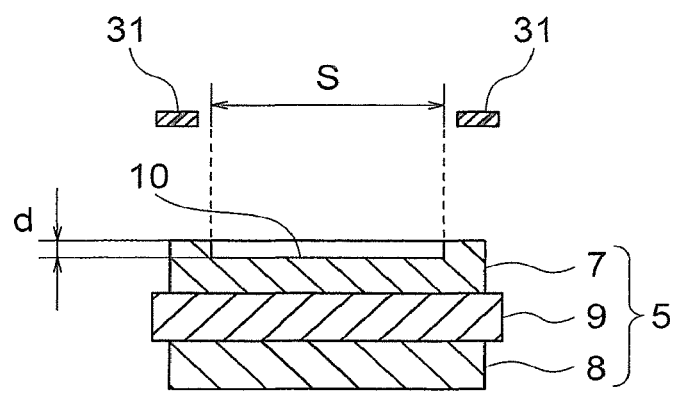
FIG. 12 is a sectional view for illustrating a state in which the resist film of FIG. 11 is removed from the substrate.

FIG. 11 is a sectional view for illustrating a state in which a resist film 31 is formed on the substrate 5 of a semiconductor element bonding body according to a second embodiment of the present invention. FIG. 12 is a sectional view for illustrating a state in which the resist film 31 of FIG. 11 is removed from the substrate 5. As illustrated in FIG. 11, a resist film 31 is formed on the first surface layer 7 in the concave portion forming step, except for the set mount area S set in the first surface layer 7 of the substrate 5, namely, an area in which the concave portion 10 is to be formed. In the concave portion forming step, the set mount area S of the first surface layer 7 is subsequently etched with an etchant to form the concave portion 10 in the set mount area S of the first surface layer 7. The height d of a level difference formed at this point in a perimeter portion of the concave portion 10 is set to 20 µm or more and less than 50 µm. An etchant for microfabrication is used to adjust the etching of the bottom surface of the concave portion 10 in a manner that gives the bottom surface of the concave portion 10 a flatness degree of λ/8.7 µm or more and λ/1.2 µm or less. As illustrated in FIG. 12, the concave portion forming step then proceeds to the removal of the resist film 31 from the first surface layer 7. The substrate 5 with the concave portion 10 formed therein is manufactured in this manner. The rest of the configuration and the procedure in the second embodiment is the same as those in the first embodiment.

Thus, the concave portion 10 can be formed in the substrate 5 by the etching of the substrate 5 as well.

Third Embodiment

Figure 13:
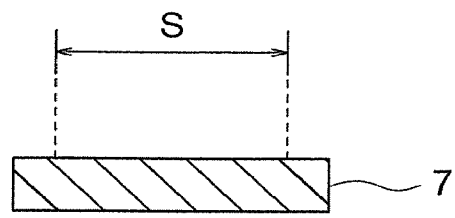
FIG. 13 is a sectional view for illustrating a first surface layer of a semiconductor element bonding body according to a third embodiment of the present invention.
Figure 14:
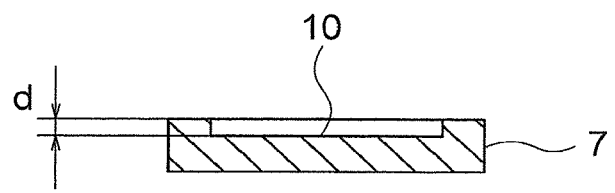
FIG. 14 is a sectional view for illustrating a state in which a concave portion is formed in the first surface layer of FIG. 13.

FIG. 13 is a sectional view for illustrating the first surface layer 7 of a semiconductor element bonding body according to a third embodiment of the present invention. FIG. 14 is a sectional view for illustrating a state in which the concave portion 10 is formed in the first surface layer 7 of FIG. 13. In the third embodiment, as illustrated in FIG. 13 and FIG. 14, the concave portion 10 is formed in the set mount area S of the first surface layer 7 that is a single layer separate from the middle layer 9, by performing press working on the first surface layer 7 in the concave portion forming step. The press working on the first surface layer 7 is performed by pressing the same pressing jig 21 as the one in the first embodiment to the first surface layer 7.

In the concave portion forming step, the first surface layer 7 and the second surface layer 8 are then each bonded to the middle layer 9, to thereby manufacture the substrate 5 in which the concave portion 10 is formed as illustrated in FIG. 5. While it is common to use an Ag—Cu eutectic brazing filler metal or an Ag—Cu—Ti brazing filler metal in the bonding of the first surface layer 7 and the second surface layer 8 to the middle layer 9, the present invention is not limited thereto. For instance, each of the first surface layer 7 and the second surface layer 8 as well as the middle layer 9 may be plated by metal plating to bond the first surface layer 7 and the second surface layer 8 directly to the middle layer 9, without a brazing filler metal interposed therebetween. The rest of the configuration and the procedure in the third embodiment is the same as those in the first embodiment.

Thus, the same effects as the effects of the first embodiment can be obtained also when the substrate 5 with the concave portion 10 formed therein is manufactured by forming the concave portion 10 in the first surface layer 7 first and then bonding the first surface layer 7 and the second surface layer 8 to the middle layer 9.

In the example described above, the substrate 5 with the concave portion 10 formed therein is manufactured by forming the concave portion 10 in the first surface layer 7 and then bonding the first surface layer 7 and the second surface layer 8 to the middle layer 9. The substrate 5 with the concave portion 10 formed therein may also be manufactured by bonding the second surface layer 8 and the middle layer 9 first and then bonding the first surface layer 7 first in which the concave portion 10 has been formed to the middle layer 9.

In the example described above, the concave portion 10 is formed in the first surface layer 7 by performing press working on the first surface layer 7. The concave portion 10 may also be formed in the first surface layer 7 by etching the first surface layer 7 as in the second embodiment.

Fourth Embodiment

Figure 15:
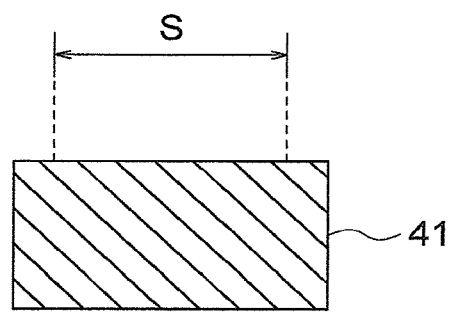
FIG. 15 is a sectional view for illustrating a metal plate without a concave portion of a semiconductor element bonding body according to a fourth embodiment of the present invention.
Figure 16:
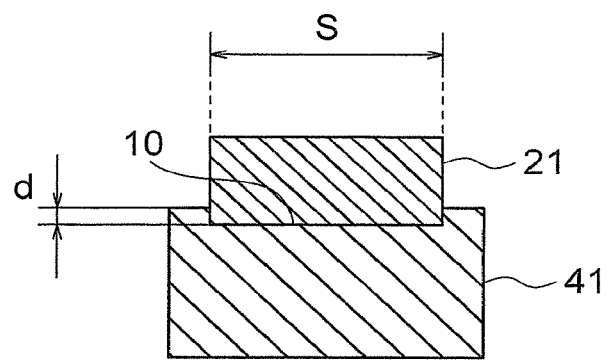
FIG. 16 is a sectional view for illustrating a state in which press working is performed on the metal plate of FIG. 15.
Figure 17:
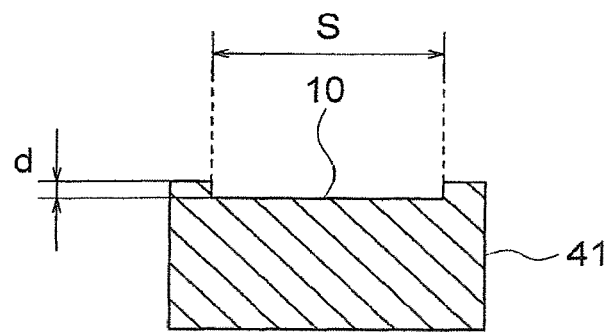
FIG. 17 is a sectional view for illustrating a state in which the concave portion is formed in the metal plate of FIG. 16.
Figure 18:
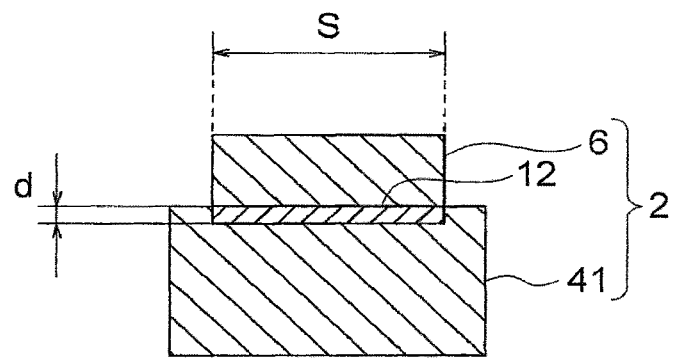
FIG. 18 is a sectional view for illustrating a state in which a semiconductor element is bonded to the metal plate of FIG. 17.

FIG. 15 to FIG. 18 are sectional views for illustrating states of a semiconductor element bonding body according to a fourth embodiment of the present invention during manufacture. FIG. 15 is a sectional view for illustrating a metal plate 41. FIG. 16 is a sectional view for illustrating a state in which press working is performed on the metal plate 41. FIG. 17 is a sectional view for illustrating a state in which the concave portion 10 is formed in the metal plate 41. FIG. 18 is a sectional view for illustrating a state in which the semiconductor element 6 is bonded to the metal plate 41.

The fourth embodiment uses the metal plate 41, which is typically a lead frame, instead of a DBC substrate, as the mount member. The metal plate 41 in this example is made of metallic Cu. The rest of the configuration in the fourth embodiment is the same as the one in the first embodiment.

The semiconductor element bonding body 2 is manufactured by the same method that is used in the first embodiment. Accordingly, to manufacture the semiconductor element bonding body 2, the metal plate 41 as the mount member is prepared as illustrated in FIG. 15, and then press working is performed on the metal plate 41 as illustrated in FIG. 16 by pressing the press surface 21a of the pressing jig 21 to the set mount area S of the metal plate 41. The press working is performed on the metal plate 41 under the same conditions as those in the first embodiment. As illustrated in FIG. 17, the concave portion 10 is thus formed in the set mount area S of the metal plate 41, to thereby manufacture the metal plate 41 with the concave portion 10 formed therein (the concave portion forming step).

As in the first embodiment, the semiconductor element 6 with the metal film 12 formed thereon is then fit in the concave portion 10. The semiconductor element 6 is placed in the concave portion 10 with the metal film 12 laid on the bottom surface of the concave portion 10 (a mounting step).

The metal film 12 and the metal plate 41 are then bonded directly to each other by applying heat and pressure to the metal plate 41 and the semiconductor element 6 in the atmospheric air. Conditions under which the metal plate film 12 and the metal plate 41 are bonded to each other are the same as the conditions in the first embodiment (the bonding step). As illustrated in FIG. 18, this completes the manufacture of the semiconductor element bonding body 2.

Thus, the same effects as those in the first embodiment can be obtained also when the metal plate 41 is used as the mount member.

In the example described above, the concave portion 10 is formed in the metal plate 41 by performing press working on the metal plate 41. The concave portion 10 may also be formed in the metal plate 41 by etching the metal plate 41 as in the second embodiment.

Although the material of the pressing jig 21 is SKD11, which is a steel product, in the embodiments described above, the present invention is not limited thereto. A material other than SKD11 may be used for the pressing jig 21 as long as the used material is harder than the material of the portion of the substrate 5 or the metal plate 41 in which the concave portion 10 is to be formed, and as long as a sufficient pressure can be applied to the used material. The press surface 21a of the pressing jig 21 is also not limited to the values of the flatness degree and the smoothness degree that are given in the embodiments, as long as the flatness degree of the bottom surface of the concave portion 10 is $\lambda/8.7$ µm or more and $\lambda/1.2$ µm or less.

Although the metal film 12 formed on the semiconductor element 6 is made of metallic Au in the embodiments described above, the metal film 12 may be made of a metal that has a high metal diffusion coefficient and contains at least one of Pt, Pd, Ag, and Cu. The use of the metal film 12 made of a metal high in metal diffusion coefficient like this reduces the temperature and time required for the solid-phase diffusion bonding of the metal film 12 to the substrate 5 or the metal plate 41, and enhances the strength of the bonding, thereby improving the reliability of the bonding as in the case where Au is used.

A variation of the substrate 5 or the metal plate 41 that has metal plating containing at least one of Pt, Pd, Ag, and Cu may be used as the mount member in the embodiments described above. This means that the material forming the portion of the mount member that corresponds to the concave portion 10 is a metal containing at least one of Pt, Pd, Ag, and Cu. Solid-phase diffusion bonding between the metal film 12 and the mount member is accordingly accomplished at a low temperature in a short time at an enhanced bonding strength.

Although the metal film 12 and the substrate 5 in the embodiments described above are bonded to each other by applying heat at a temperature of 300° C. and a pressurizing force of 30 MPa in the bonding step, the present invention is not limited thereto. The metal film 12 can be bonded to the substrate 5 or the metal plate 41 as long as the temperature in the bonding step is 200° C. or more and less than 350° C. and the pressurizing force in the bonding step is 1 MPa or more and less than 50 MPa. When the temperature and the pressurizing force in the bonding step are within those ranges, the semiconductor element 6 after the bonding step sustains no thermal damage from the heating in the bonding step and no mechanical damage from the pressurization in the bonding step.

REFERENCE SIGNS LIST 1 semiconductor device, 2 semiconductor element bonding body, 3 bonding material, 4 heat dissipation plate, 5 substrate (mount member), 6 semiconductor element, 10 concave portion, 12 metal film, 41 metal plate (mount member)

The invention claimed is:

1. A semiconductor element bonding body, comprising:
   a mount including a concave portion;
   a semiconductor element in the concave portion and mounted to the mount; and
   a metal film on the semiconductor element,
   wherein the concave portion of the mount includes metal,
   wherein the concave portion has a perimeter portion including a level difference which has a height of 20 µm or more and less than 50 µm,
   wherein the concave portion includes a bottom surface having a flatness degree of $\lambda/8.7$ µm or more and $\lambda/1.2$ µm or less when a wavelength $\lambda$ of a laser is 632.8 nm,
   wherein the bottom surface of the concave portion and the metal film are bonded directly to each other.

2. The semiconductor element bonding body according to claim 1, wherein the metal film includes a material that contains at least one metal selected from a group consisting of Au, Ag, Cu, Pt, and Pd.

3. The semiconductor element bonding body according to claim 1,
   wherein the metal film includes a material that contains Au,
   wherein the metal forming the portion of the mount in which the concave portion is formed includes Cu, and
   wherein holes having an average hole diameter of 0.1 µm or more and less than 0.4 µm are present in a boundary between the bottom surface of the concave portion and the metal film.

4. A semiconductor device, comprising:
   the semiconductor element bonding body of claim 1; and
   a heat dissipation plate bonded to the mount via a bonding material.

5. A method of manufacturing the semiconductor element bonding body of claim 1, comprising:
   a concave portion forming step of manufacturing the mount including having the concave portion formed therein;
   a mounting step of placing the semiconductor element in the concave portion with the metal film, which is formed on the semiconductor element, laid on the bottom surface of the concave portion after the concave portion forming step; and
   a bonding step of bonding the metal film and the mount to each other by applying, after the mounting step, heat at a temperature of 200° C. or more and less than 350° C. and a pressurizing force of 1 MPa or more and less than 50 MPa.

6. The method of manufacturing the semiconductor element bonding body according to claim 5, wherein, in the concave portion forming step, the concave portion is formed in the mount by performing press working on the mount at a pressing pressure of 80 MPa or more and 120 MPa or less.

* * * * *